US006900070B2

(12) United States Patent
Craven et al.

(10) Patent No.: US 6,900,070 B2
(45) Date of Patent: May 31, 2005

(54) DISLOCATION REDUCTION IN NON-POLAR GALLIUM NITRIDE THIN FILMS

(75) Inventors: Michael D. Craven, Goleta, CA (US);
Steven P. Denbaars, Goleta, CA (US);
James Stephen Speck, Goleta, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 10/413,913

(22) Filed: Apr. 15, 2003

(65) Prior Publication Data

US 2003/0230235 A1 Dec. 18, 2003

Related U.S. Application Data

(60) Provisional application No. 60/372,909, filed on Apr. 15, 2002.

(51) Int. Cl.$^7$ ............................................. H01L 21/00
(52) U.S. Cl. ..................... 438/41; 438/481; 257/E21.108
(58) Field of Search .............................. 438/41, 46, 48, 438/71, 481, 584, 590, 778, 786; 257/E21.108, E21.112–3, E21.117, E21.125–7

(56) References Cited

U.S. PATENT DOCUMENTS

| | | | | |
|---|---|---|---|---|
| 6,051,849 A | * | 4/2000 | Davis et al. ................. | 257/103 |
| 6,177,292 B1 | | 1/2001 | Hong et al. | |
| 6,180,270 B1 | | 1/2001 | Cole et al. | |
| 6,268,621 B1 | * | 7/2001 | Emmi et al. ................. | 257/302 |
| 6,350,666 B2 | | 2/2002 | Kryliouk | |
| 6,413,627 B1 | | 7/2002 | Motoki et al. | |
| 6,582,986 B2 | | 6/2003 | Kong et al. | |
| 6,602,763 B2 | | 8/2003 | Davis et al. | |
| 6,623,560 B2 | * | 9/2003 | Biwa et al. ................. | 117/95 |
| 6,635,901 B2 | | 10/2003 | Sawaki et al. | |
| 6,645,295 B1 | | 11/2003 | Koike et al. | |
| 2001/0029086 A1 | | 10/2001 | Ogawa et al. | |
| 2002/0047113 A1 | | 4/2002 | Ohno et al. | |
| 2002/0098641 A1 | | 7/2002 | Tsuda et al. | |
| 2004/0108513 A1 | | 6/2004 | Narukawa et al. | |

FOREIGN PATENT DOCUMENTS

| | | | |
|---|---|---|---|
| EP | 0 942 459 | 9/1999 | |
| JP | 10312971 A | * 11/1998 | ......... H01L/21/205 |
| JP | 2001 257166 | 9/2001 | |
| JP | 2002 076329 | 3/2002 | |
| JP | 2002076521 | 3/2002 | |

OTHER PUBLICATIONS

U.S. Appl. No. 60/372,909, filed Apr. 15, 2002.*

(Continued)

Primary Examiner—George Fourson
Assistant Examiner—Thanh V Pham
(74) Attorney, Agent, or Firm—Gates & Cooper LLP

(57) ABSTRACT

Lateral epitaxial overgrowth of non-polar (11$\bar{2}$0) a-plane GaN seed layers reduces threading dislocations in the GaN films. First, a thin patterned dielectric mask is applied to the seed layer. Second, a selective epitaxial regrowth is performed to achieve a lateral overgrowth based on the patterned mask. Upon regrowth, the GaN films initially grow vertically through openings in the dielectric mask before laterally overgrowing the mask in directions perpendicular to the vertical growth direction. Threading dislocations are reduced in the overgrown regions by (1) the mask blocking the propagation of dislocations vertically into the growing film and (2) the bending of dislocations through the transition from vertical to lateral growth.

22 Claims, 5 Drawing Sheets

OTHER PUBLICATIONS

Wang, F. et al., "Crystal Tilting in the Epitaxial Laterally Overgrown GaN Films on Sapphire Substrate by Hydride Vapor Phase Epitaxy", Solid State and Integrated–Circuit Technology Proceedings, 6$^{th}$ International Conference, Oct. 2001, vol. 2, pp. 1998–1201.

Maruska, H.P. et al., "Development of 50 mm Diameter Non–Polar Gallium Nitride Substrates for Device Applications", International Conference on Indium Phosphide and Related Materials, May 16, 2003, pp. 567–570.

Amano, H., et al., "Metalorganic vapor phase epitaxial growth of a high quality GaN film using an AIN buffer layer" Appl. Phys. Lett. 48 (5), Feb. 3, 1986, pp 353–355.

Ambacher, O., et al., "Two–dimensional electron gases induced by spontaneous piezoelectric polarization charges in N– and Ga–face AlGaN/GaN heterostructures" J. Appl. Phys., 85 (6), Mar. 15, 1999, pp. 3222–3233.

Bottcher, T., et al., "The role of high–temperature island coalescence in the development of stresses in–GaN films" Appl. Phys. Lett. 78 (14), Apr. 2, 2001, pp. 1976–1978.

Brandt, O., et al., "Determination of strain state and composition of highly mismatched group–111 nitride heterostructures by x–ray diffraction" J. Phys. D. Appl. Phys. 35 (2002), pp. 577–585.

Craven, M.D., et al., "Characterization of a–Plane GaN/(Al, Ga)N Multiple Quantum Wells Grown via Metalorganic Chemical Vapor Deposition" Jpn. J. Appl. Phys. vol. 42, (2003), pp. L235–L238.

Craven, M.D., et al., "Threading dislocation reduction via laterally overgrown nonpolar (1120) a–plane GaN" Appl. Phys. Lett. 81 (7), Aug. 12, 2002, pp. 1201–1203.

Dovidenko, K., et al., Characteristics of stacking faults in AIN thin films J. Appl. Phys. 82 (9), Nov. 1, 1997, pp. 4296–4299.

Eastman, L.F., "The Toughest Transistor Yet" IEEE Spectrum 39 (5), May 2002, pp. 28–33.

Eddy, C.R., Jr., "Growth of gallium nitride thin films by electron cyclotron resonance microwave plasma–assisted molecular beam epitaxy" J. Appl. Phys. 73 (1), Jan. 1, 1993, pp. 448–455.

Etzkom, E.V., et al., "Cracking of GaN films" J. Appl. Phys. 89 (2), Jan. 15, 2001, pp. 1025–1034.

Freitas, J. A., Jr., et al., "Optical characterization of lateral epitaxial overgrown GaN layers" Appl. Phys. Lett. 72 (23), Jun. 8, 1998, pp. 2990–2992.

Grandjean, N., et al., "Built–in electric–field effects in wurtzite AlGaN quantum wells" J. Appl. Phys. 86 (7), Oct. 1, 1999, pp. 3714–3720.

Heying, B., et al., "Role of threading dislocation structure on the x–ray diffraction peak widths in epitaxial GaN films" Appl. Phys. Lett. 68 (5), Jan. 29, 1996, pp. 643–645.

Im, J.S., et al., "Reduction of oscillator strength due to piezoelectric fields in GaN/Al$_x$Ga$_{1-x}$N quantum wells" Phys. Rev. B. 57 (16), Apr. 15, 1998–II, pp. R9435–R9438.

Iwata, K., et al., "Gas Source Molecular Beam Epitaxy Growth of GaN on C–, A–, R–, and M–Plane Sapphire and Silica Glass Substrates" Jpn. J. Appl. Phys. vol. 36 (1977), pp. L 661–L664.

Kapolnek, D., et al., "Anisotrophic epitaxial lateral growth in GaN selective area epitaxy" Appl. Phys. Lett. 71 (9), Sep. 1, 1997, pp. 1204–1206.

Langer, R., et al., "Giant electric fields in unstrained GaN single quantum wells" Appl. Phys. Lett., 74 (25), Jun. 21, 1999, pp. 3827–3829.

Lefebvre, P. et al., "High internal electric field in a graded–width InGaN/GaN quantum well: Accurate determination by time–resolved photoluminescence spectroscopy" Appl. Phys. Lett. 78 (9), Feb. 26, 2001, pp. 1252–1254.

Lefebvre, P., et al., "Time–resolved photoluminescence as a probe of internal electric fields in GaN–(GaAl)N quantum wells" Phys. Rev. B. 59 (23), Jun. 15, 1999–I, pp. 15363–15367.

Lei, T., "Heteroepitaxy, polymorphism, and faulting in GaN thin films on silicon and sapphire substrates" J. Appl. Phys. 74(7), Oct. 1, 1993, pp. 4430–4437.

Leroux, M., "Barrier–width dependence of group–III nitrides quantum–well transition energies" Phys. Rev. B. 60 (3), Jul. 15, 1991–1, pp. 1496–1499.

Leszczynski, M., et al., "Lattice parameters of gallium nitride" Appl. Phys. Lett. 69 (1), Jul. 1, 1996, pp. 73–75.

Marchand, H., et al., "Microstructure of GaN laterally overgrown by metalorganic chemical vapor deposition" Appl. Phys. Lett. 73 (6), Aug. 10, 1998, pp. 747–749.

Marchand, H., et al., "Atomic force microscopy observation of threading dislocation density reduction in lateral epitaxial overgrowth of gallium nitride by MOCVD" MRS Internet J. Nitride Semicond. Res. 3, 3 (1998), pp. 1–7.

Metzger, Th., et al., "X–Ray Diffraction Study of Gallium Nitride Grown by MOCVD" Physica status solidi (b) 193, 1996, pp. 391–7.

B. Monemar, et al., "Properties of Zn–doped VPE–grown GaN.I.Luminescence data in relation to doping conditions", J. Appl. Phys. 51 (1), Jan. 1980, pp. 625–639.

Moustakas, T.D., et al., "Growth of GaN by ECR–assisted MBE" Physica B 185, 1993, pp. 36–49.

Motoki, J., et al., "Preparation of Large Freestanding GaN Substrates by Hydride Vapor Phase Epitaxy Using GaAs as a Starting Substrate" Jpn. J. Appl. Phys. vol. 40 (2), (2001), pp. L140–L143.

Nakamura, S, et. al., "Violet InGaN/GaN/AlGaN–Based Laser Diodes Operable at 50° C with a Fundamental Transverse Mode" Jpn. J. Appl. Phys. 38 (2), 1999, pp. L226–L229.

Nam, O., et al., "Lateral epitaxy of low defect density GaN layers via organometallic vapor phase epitaxy" Appl. Phys. Lett. 71 (18), Nov. 3, 1997, pp. 2638–2640.

Nataf, G., et al., "Lateral overgrowth of high quality GaN layers on GaN/Al$_2$O$_3$ patterned substrates by halide vapour–phase epitaxy" J. of Crystal Growth (192), Feb. 20, 1998, pp. 73–78.

Ng, H. M., "Molecular–beam epitaxy of GaN/Al$_x$Ga$_{1-x}$N multiple quantum wells on R–plane (1012) sapphire substrates" Appl. Phys. Lett. 80 (23), Jun. 10, 2002, pp. 4369–4371.

Nishida, T., et al., "Ten Milliwatt Operation of an AlGaN–Based Light Emitting Diode Grown on GaN Substrate" Phys. Stat. Sol. (a) 188 (1), pp. 113–116.

Park, S., et al., "Spontaneous polarization effects in wurzite GaN/AlGaN quantum wells and comparison with experiment" Appl. Phys. Lett. 76 (15), Apr. 10, 2000, pp. 1981–1983.

Park, J., et al., "Selective–area and lateral epitaxial overgrowth of III–N materials by metal organic chemical vapor deposition" Appl. Phys. Lett. 73 (3), Jul. 20, 1998, pp. 333–335.

Parilliaud, O., et al., "Localized Epitaxy of GaN by HVPE on patterned Substrates" MRS Internet J. Nitride Semicond. Res. 3 (40), Oct. 19, 1998, pp. 1–9.

Paskova, T., et al., "Defect Reduction in HVPE Growth of GaN and Related Optical Spectra" Phys. Stat. Sol. (a) 183, (2001), pp. 197–203.

Rosner, S.J., et al., "Cathodoluminescence mapping of epitaxial lateral overgrowth in gallium nitride" Appl. Phys. Lett. 74 (14), Apr, 5, 1999, pp. 2035–2037.

Sakai, A., et al., "Self-organized propagation of dislocations in GaN films during epitaxial lateral growth" Appl. Phys. Lett. 76 (4), Jan. 24, 2000, pp. 442–444.

Sano, M., et al., "Epitaxial Growth of Undoped and Mg-Doped GaN" Jpn. J. of Appl. Phys. 15 (10), Oct. 1976, pp. 1943–1950.

Sasaki, T., et al., "Substrate-orientation dependence of GaN single-crystal films grown by metalorganic vapor-phase epitaxy",J. of Appl. Phys. American Institute of Physics, vol. 61 (7), Apr. 1, 1987, pp. 2533–2540. quantum wells on R-plane (20

Shintani, A., et al. "Light Emitting Patterns of Gallium Nitride Electroluminescence" J. Electrochem. Soc. 123 (10), Oct. 1976, pp. 1575–1578.

Smorchkova, J.P., et. al., "Polarization-induced charge and electron mobility in AlGaN/GaN heterostructures grown by plasma-assisted molecular-beam epitaxy" J. Appl. Phys. 86 (8), Oct. 15, 1999, pp. 4520–4526.

Sun, Chien–Jen, et al., "Comparison of the physical properties of GaN thin films deposited on (0001) and (0112) sapphire substrates", Appl. Phys. Lett., vol. 63 (7), 1993, pp. 973–975.

Takeuchi, T., et al., "Determination of piezoelectric fields in strained GaInN quantum wells using the quantum–confined Stark effect" Appl. Phys. Lett. 73 (12), Sep. 21, 1998, pp. 1691–1693.

Takeuchi, T., et al., "Quantum–Confined Stark Effect due to Piezoelectric Fields in GaInN Strained Quantum Wells" Jpn. J. Appl. Phys. vol. 36, Apr. 1, 1997, pp. L382–385.

Tan, I–H., et al., "A self consistent solution of Schrodinger–Poisson equations using a nonuniform mesh" J. Appl. Phys. 68 (8), Oct. 15, 1990, pp. 4071–4076.

Tsuchiya, H., et al., "Growth condition dependence of GaN crystal structure on (0 0 1)GaAs by hydride vapor–phase epitaxy" J. of Crystal Growth (189/190), 1998, pp. 395–400.

Waltereit, P., et. al., "Nitride semiconductors free of electrostatic fields for efficient white light–emitting diodes" Nature vol. 406, Aug. 24, 2000, pp. 865–868.

Wright, A. F., "Elastic properties of zinc–blende and wurtzite AlN, GaN, and InN" J. Appl. Phys. 82 (6), Sep. 15, 1997, pp. 2833–2839.

Yablonovitch, E., et. al., "Reduction of Lasing Threshold Current Density by the Lowering of Valence Band Effective Mass" J. of Lightwave Tech. vol. LT–4 (5), May 1986, pp. 504–506.

Zheleva, T., et al., "Dislocation density reduction via lateral epitaxy in selectively grown GaN structures" Appl. Phys. Lett. 71 (17), Oct. 27, 1997, pp. 2472–2474.

Zheleva, T., et al., "Pendo–epitaxy– A new approach for lateral growth of gallium nitride structures" MRS Internet J. Nitride Semicond. Res. 4S1, G3.38 (1999).

Yu., Z., et al., "Epitaxial lateral overgrowth of GaN on SiC and sapphire substrates" MRS Internet J. Nitride Semicond. Res. 4S1, G4.3 (1999).

M.D. Craven et al., "Structural characterization of nonplar (1120) α–plane GaN thin films grown on (1102) r–plane sapphire," Jul. 2002, Applied Physics Letters, 81(3):469–471.

Craven, M.D., et al., "Structural characterization of nonpolar (1120) α–plane GaN thin films grown on (1102) r–plane sapphire", Applied Physics Letters, vol. 81, No. 3, Jul. 15, 2002, pp. 469–471, XP002250684.

Dupuis, R.D., et al., "Selective–area and lateral epitaxial overgrowth of III–N materials by metalorganic chemical vapor deposition", Journal of Crystal Growth, vol. 195, No. 1–4, Dec. 15, 1998, pp. 340–345, XP004154285.

Grzegory, I., et al., "Seeded growth of GaN at high $N_2$ pressure on ( 0 0 0 1) polar surfaces of GaN single crystalline substrates", Materials Science in Semiconductor Processing, vol. 4, No. 6, Dec. 2001, pp. 535–541, XP004345737.

Liu, L. et al., "Substrates for gallium nitride epitaxy", Materials Science and Engineering R, Reports: A Review Journal, vol. 37, No. 3, Apr. 30, 2002, pp. 61–127, XP004349792.

Marchand, H., et al., "Mechanisms of lateral epitaxial overgrowth of gallium nitride by metalorganic chemical vapor deposition", Journal of Crystal Growth, vol. 195, No. 1–4, Dec. 15, 1998, pp. 328–332, XP004154283.

Mills, Alan, "Wide–bandgap emitters continue to improve", III–Vs Review, vol. 13, No. 3, May 2000, pp. 23–24, 26, 28–30, XP004200697.

Amano, H., et al., "Metalorganic vapor phase epitaxial growth of a high quality GaN film using an AIN buffer layer" Appl. Phys. Lett. 48 (5), Feb. 3, 1986, pp 353–355.

Ambacher, O., et al., "Two–dimensional electrons gases induced by spontaneous and piezoelectric polarization charges in N–adn Ga–face AlGaN/GaN heterostructures" J. Appl. Phys., 85 (6), Mar. 15, 1999, pp. 3222–3233.

Bottcher, T., et al., "The role of high–temperature island coalescence in the development of stresses in GaN films" Appl. Phys. Lett. 78 (14), Apr. 2, 2001, pp. 1976–1978.

Brandt, O., et al., "Determination of strain state and composition of highly mismatched group–III nitride heterostructures by x–ray diffraction" J. Phys. D. Appl. Phys. 35 (2002), pp. 577–585.

Craven, M.D., et al., "Characterization of a–Plane GaN/(Al, Ga)N Multiple Quantum Wells Grown via Metalorganic Chemical Vapor Deposition" Jpn. J. Appl. Phys. vol. 42, (2003), pp. L235–L238.

Craven, M.D., et al., "Threading dislocation reduction via laterally overgrown nonpolar (1120) a–plane GaN" Appl. Phys. Lett. 81 (7), Aug. 12, 2002, pp. 1201–1203.

Dovidenko, K., et al., Characterisics of stacking faults in AIN thin films J. Appl. Phys. 82 (9), Nov. 1, 1997, pp. 4296–4299.

Eastman, L.F., "The Toughest Transistor Yet" IEEE Spectrum 39 (5), May 2002, pp. 28–31.

Eddy. C.R., Jr., "Growth of gallium nitride thins films by electron cyclotron resonance microwave plasma–assisted 448–ular beam epitax" J. Appl. Phys. 73 (1), Jan. 1, 1993, pp. 448–455.

Etzkom, E.V., et al., "Cracking of GaN films" J. Appl. Phys. 89 (2), Jan. 15, 2001, pp. 1025–1034.

Freitas, J. A., Jr., et al., "Optical characterization of lateral epitaxial overgrown GaN layers" Appl. Phys. Lett. 72 (23), Jun. 8, 1998, pp. 2990–2992.

Grandjean, N., et al., "Built–in electric–field effects in wurtzite AlGaN quantum wells" J. Appl. Phys. 86 (7), Oct. 1, 1999, pp. 3714–3720.

Heying, B., et al., "Role of threading dislocation structure on the x–ray diffraction peak widths in epitaxial GaN films" Appl. Phys. Lett. 68 (5), Jan. 29, 1996, pp. 643–645.

Im, J.S., et al., "Reduction of oscillator strength due to piezoelectric fields in GaN/Al$_x$Ga$_{1-x}$N quantum wells" Phys. Rev. B. 57 (16), Apr. 15, 1998–II, pp. R9435–R9438.

Iwata, K., et al., "Gas Source Molecular Beam Epitaxy Growth of GaN on C–, A–, R–, and M–Plane Sapphire and Silica Glass Substrates" Jpn. Appl. Phys. vol. 36 (1997), pp. L 661–L664.

Kapolnek, D., et al., "Anisotropic epitaxial lateral growth in GaN selective area epitaxy" Appl. Phys. Lett. 71 (9), Sep. 1, 1997, pp. 1204–1206.

Langer, R., et al., "Giant electric fields in unstrained GaN single quantum wells" Appl. Phys. Lett., 74 (25), Jun. 21, 1999, pp. 3827–3829.

Lefebvre, P. et al., "High internal electric field in a graded width InGaN/GaN quantum well Accurate determination by time–resolved photoluminescence spectroscopy" Appl. Phys. Lett. 78 (9), Feb. 26, 2001, pp. 1252–1254.

Lefebvre, P., et al., "Time–resolved photoluminescence as a probe of internal electric fields in GaN–(GaAl)N quantum wells" Phys. Rev. B. 59 (25), Jun. 15, 1999–1, pp. 15363–15367.

Lei, T., "Heteroepitaxy, polymprphism, and faulting in GaN thin films on silicon and sapphire substrates" J. Appl. Phys. 74 (7), Oct. 1, 1993, pp. 4430–4437.

Leroux, M., "Barrier–width dependence of group–III nitride quantum–well transition energies" Phys. Rev. B. 60 (3), Jul. 15, 1991–I, pp. 1496–1499.

Leszczynski, M., et al., "Lattice parameters of gallium nitride" Appl. Phys. Lett. 69 (1), Jul. 1, 1996, pp. 73–75.

Marchand, H., et al., "Microstructure of GaN laterally overgrown by metalorganic chemical vapor deposition" Appl. Phys. Lett. 73 (6), Aug. 10, 1998, pp. 747–749.

Marchand, H., et al., "Atomic force microscopy observaton of threading dislocation density reduction in lateral epitaxial overgrowth of gallium nitride by MOCVD" MRS Internet J. Nitride Semicond. Res. 3, 3 (1998), pp. 1–7.

Metzger, Th., et al., "X–Ray Diffraction Study of Gallium Nitride Grown by MOCVD" Physics status solidi (b) 193, 1996. pp. 391–7.

B. Monemar, et al., "Properties of Zn–doped VPE–grown GaN,I, Luminescence data in relation to doping conditions" J. Appl. Phys. 51 (1), Jan. 1980, pp. 625–639.

Moustakas, T.D., et al., "Growth of GaN by ECR–assisted MBE" Physics B 185, 1993, pp. 36–49.

Motoki, J., et al., "Preparation of Large Freestanding GaN Substrates by Hydride Vapor Phase Epitaxy Using GaAs as a Starting Substrate" Appl. Phys. vol. 40 (2), (2001), pp. L140–L143.

Nakamura,S, et al., "Violet InGaN/GaN/AlGaN–Based Laser Diodes Operable at 50 ° C. with a Fundamental Transverse Mode" Jpn. J. Appl. Phys. 38 (2), 1999, pp. L226–L229.

Nam, O., et al., "Lateral epitaxy of low defects density GaN layers via organometallic vapor phase epitaxy" Appl. Phys. Lett. 71 (18), Nov. 3, 1997, pp. 2638–2640.

Nataf, G., et al., "Lateral overgrowth of high quality GaN layers on GaN/Al$_2$O$_3$ patterned substrates by halide vapour–phase epitaxy" J. of Crystal Growth (192), Feb. 20, 1998, pp. 73–78.

Ng, H. M., "Molecular–beam epitaxy of GaN/Al$_2$Ga$_{1-x}$N multiple quantum wells on R–plane (1012) sapphire substrates" Appl. Phys. Lett. 80 (23), Jun. 10, 2002, pp. 4369–4371.

Nishida, T., et al., "Ten Milliwatt Operation of an AlGaN–Based Light Emitting Diode Growns on GaN Substrate" Phys. Stat. Sol. (a) 188 (1), 2001, pp. 113–116.

Park, S., et al., "Spontaneous polarization effects in wurtzite GaN/AlGaN quantum wells and comparison with experiment" Appl. Phys. Lett. 76 (15), Apr. 10, 2000, pp. 1981–1983.

Park, J., et al., "Selective–area and lateral epitaxial overgrowth of III–N materials by metal organic chemical vapor deposition" Appl. Phys. Lett. 73 (3), Jul. 20, 1998, pp. 333–335.

Parilliaud, O., et al., "Localized Epitaxy of GaN by HVPE on patterned Substrates" MRS Internet J. Nitride Semicond. Res. 3 (40), Oct. 19, 1998, pp. 1–9.

Paskova, T., et al., "Defect Reduction in HVPE Growth of GaN and Related Optical Spectra" Phys. Stat. Sol. (a) 183, (2001), pp. 197–203.

Rosner, S.J., et al., "Cathodoluminescence mapping of epitaxial lateral overgrowth in gallium nitride" Appl. Phys. Lett. 74 (14), Apr. 5, 1999, pp. 2035–2037.

Sakai, A., et al., "Self–organized propagation of dislocation in GaN films during epitaxial lateral growth" Appl. Phys. Lett. 76 (4), Jan. 24, 2000, pp. 442–444.

Sano, M., et al., "Epitaxial Growth of Undoped and Mg–Doped GaN" Jpn. of Appl. Phys. 15 (10), Oct. 1976, pp. 1943–1950.

Sasaki, T., et al., "Substrate–orientation dependence of GaN single–crystal films grown by metalorganic vapor–phase epitaxy", J. of Appl. Phys. American Institute of Physics, vol. 61 (7), Apr. 1, 1987, pp. 2533–2540.

Shintani, A., et al., "Light Emitting Patterns of Gallium Nitride Electroluminescence" J. Electrochem. Soc. 123 (10), Oct. 1976, pp. 1575–1578.

Smorchkova, I.P., et al., "Polarization–induced charge and electron mobility in AlGan/GaN heterostructures grown by plasma–assisted molecular–beam epitaxy" J. Appl. Phys. 86 (8), Oct. 15, 1999, pp. 4520–4526.

Sun, Chie–Jen, et al., "Comparison of the physical properties of GaN thin films deposited on (001) and (0112) sapphire substrates", Appl. Phys. Lett., vol. 63 (7), 1993, pp. 973–975.

Takeuchi, T., et al., "Determination of piezoelectric fields in strained GaInN quantum wells using the quantum–confined Stark effect" Appl. Phys. Lett. 73 (12), Sep. 21, 1998, pp. 1691–1693.

Takeuchi, T., et al., "Quantum Wells" Jpn. J. Appl. Phys. vol. 36, Apr. 1, 1997, p. L382–385.

Tan, I–H., et al., "A self consistent solution of Schrodinger–Poisson equations using a nonuniform mesh" J. Appl. Phys. 68 (8), Oct. 15, 1990, pp. 4071–4076.

Tsuchiya, H., et al., "Growth condition dependence on GaN crystal structure on (0 0 1)GaAs by hydride vapor–phase epitaxy" J. of Crystal Growth (189/190), 1998, pp. 395–400.

Waltereit, P., et al., "Nitride semiconductors free of electrostatic fields for efficient white light–emitting diodes" Nature vol. 406, Aug. 24, 2000, pp. 865–868.

Wright, A.F., "Elastic properties of zinc–blende and wurtzite AlN, GaN, and InN" J. Appl. Phys. 82 (6), Sep. 15, 1997, pp. 2833–2839.

Yablonovitch, E., et al., "Reduction of Lasing Threshold Current Density by the Lowering of Valence Band Effectiveness Mass" J. of Lightwave Tech. vol. LT–4 (5), May 1986, pp. 504–506.

Zheleva, T., et al., "Dislocation density reduction via lateral epitaxy in selectively grown GaN structures" Appl. Phys. Lett. 71 (17), Oct. 27, 1997, pp. 2472–2474.

Zheleva, T., et al., "Pendo–epitaxy—A new approach for lateral growth of gallium nitride structures" MRS Internet J. Nitride Semicond. Res. 4S1, G3.38 (1999).

Yu, Z., et al., "Epitaxial lateral overgrowth of GaN on SiC and sapphire substrates" MRS Internet J. Nitride Semicond. Res. 4S1, G4.3 (1999).

* cited by examiner

DISLOCATION REDUCTION IN NON-POLAR GALLIUM NITRIDE THIN FILMS

CROSS-REFERENCE TO RELATED APPLICATIONS

This application claims the benefit under 35 U.S.C. §119(e) of the following co-pending and commonly-assigned U.S. Provisional Patent Application Ser. No. 60/372,909, entitled "NON-POLAR GALLIUM NITRIDE BASED THIN FILMS AND HETEROSTRUCTURE MATERIALS," filed on Apr. 15, 2002, by Michael D. Craven, Stacia Keller, Steven P. DenBaars, Tal Margalith, James S. Speck, Shuji Nakamura, and Umesh K. Mishra, which application is incorporated by reference herein.

This application is related to the following co-pending and commonly-assigned U.S. utility patent applications:

Ser. No. 10/413,690, entitled "NON-POLAR (Al,B,In,Ga)N QUANTUM WELL AND HETEROSTRUCTURE MATERIALS AND DEVICES," filed on Apr. 15, 2003, by Michael D. Craven, Stacia Keller, Steven P. DenBaars, Tal Margalith, James S. Speck, Shuji Nakamura, and Umesh K. Mishra, which application claims the benefit under 35 U.S.C. §119(e) of co-pending and commonly-assigned U.S. Provisional Patent Application Ser. No. 60/372,909, entitled "NON-POLAR GALLIUM NITRIDE BASED THIN FILMS AND HETEROSTRUCTURE MATERIALS," filed on Apr. 15, 2002, by Michael D. Craven, Stacia Keller, Steven P. DenBaars, Tal Margalith, James S. Speck, Shuji Nakamura, and Umesh K. Mishra; and Ser. No. 10/413,691, entitled "NON-POLAR A-PLANE GALLIUM NITRIDE THIN FILMS GROWN BY METALORGANIC CHEMICAL VAPOR DEPOSITION," filed on Apr. 15, 2003, by Michael D. Craven and James S. Speck, which application claims the benefit under 35 U.S.C. §119(e) of co-pending and commonly-assigned U.S. Provisional Patent Application Ser. No. 60/372,909, entitled "NON-POLAR GALLIUM NITRIDE BASED THIN FILMS AND HETEROSTRUCTURE MATERIALS," filed on Apr. 15, 2002, by Michael D. Craven, Stacia Keller, Steven P. DenBaars, Tal Margalith, James S. Speck, Shuji Nakamura, and Umesh K. Mishra; both of which applications are incorporated by reference herein.

FIELD OF THE INVENTION

The invention is related to semiconductor materials, methods, and devices, and more particularly, to dislocation reduction in non-polar gallium nitride (GaN) thin films.

DESCRIPTION OF THE RELATED ART (Note: This application references a number of different patents, applications and/or publications as indicated throughout the specification by one or more reference numbers. A list of these different publications ordered according to these reference numbers can be found below in the section entitled "References." Each of these publications is incorporated by reference herein.)

Current nitride-based devices employ heterostructures grown along the polar [0001] c-direction, resulting in the formation of strong electrostatic fields parallel to the growth direction. See References 1–7. The "built-in" electrostatic fields are created by fixed sheet charges associated with polarization discontinuities at surfaces and interfaces within c-plane (0001) nitride structures.

These polarization-induced electric fields affect the performance of current state-of-the-art optoelectronic and electronic nitride devices. For example, the polarization fields spatially separate electron and hole wave functions in quantum well (QW) structures, thereby reducing carrier recombination efficiencies in QW-based devices such as laser diodes and light emitting diodes (LEDs). Additionally, the polarization fields induce large mobile sheet charge densities in transistor structures which employ nitride heterostructures. Discontinuities in total polarization result in the formation of fixed sheet charges at the corresponding interfaces or surfaces.

Epitaxial growth of non-polar wurtzite nitride semiconductor films provides a promising means of eliminating polarization-induced electric field effects in nitride quantum structures. In the related applications identified above, non-polar ($11\bar{2}0$) a-plane GaN films (referred to herein as a-GaN) have been grown on ($1\bar{1}20$) r-plane sapphire substrates via metalorganic chemical vapor deposition (MOCVD). See Reference 13. However, the threading dislocation density present in these films has been determined to be approximately $2.6 \times 10^{10}$ cm$^{-2}$.

To fully realize the advantages of non-polar nitride layers, improvements in epitaxial film quality are necessary, and in particular reductions in dislocation density are necessary. Specifically, improving the crystal quality of these films is fundamental to the realization of high-performance nitride devices which operate free from polarization-induced electric fields.

Although a variety of techniques have been demonstrated, dislocation reduction has been extensively studied in laterally overgrown polar GaN films. See References 8–11. Low dislocation density substrates obtained through various lateral overgrowth techniques are directly responsible for the remarkable performance of nitride-based optoelectronics, and most notably, enhanced lifetime continuous wave InGaN laser diodes. See Reference 12.

Lateral overgrowth techniques are well known in the prior art. For example, lateral overgrowth techniques have been thoroughly studied for dislocation reduction of polar c-plane (0001) GaN films. Specific overgrowth techniques include lateral epitaxial overgrowth (LEO), which is also known as epitaxial lateral overgrowth (ELO or ELOG), and PENDEO® epitaxy. Despite the differences between these processes, dislocation reduction is achieved by common mechanisms, primarily mask blocking and dislocation bending. See References 11 and 19.

However, the present invention is a novel application of those methods for a-GaN films. Specifically, the present invention describes a LEO method using a-GaN seed layers that achieves threading dislocation reduction. Low dislocation density a-GaN can be used as a buffer layer for high performance, polarization-induced field free (Al,B,In,Ga)N-based devices.

SUMMARY OF THE INVENTION

Lateral epitaxial overgrowth of non-polar ($11\bar{2}0$) a-plane GaN thin films reduces threading dislocations in the GaN films. First, a thin patterned dielectric mask is applied to the seed layer. Second, a selective epitaxial regrowth is performed to achieve a lateral overgrowth based on the patterned mask. Upon regrowth, the GaN films initially grow vertically through openings in the dielectric mask before laterally overgrowing the mask in directions perpendicular to the vertical growth direction. Threading dislocations are reduced in the overgrown regions by (1) the mask blocking the propagation of dislocations vertically into the growing film and (2) the bending of dislocations through the transition from vertical to lateral growth.

BRIEF DESCRIPTION OF THE DRAWINGS

Referring now to the drawings in which like reference numbers represent corresponding parts throughout:

FIGS. 5(a), (b) and (c) are plan-view panchromatic CL images of stripes oriented parallel to [0001], [$\bar{1}$101], and [$\bar{1}$100], while FIG. 5(d) illustrates the crystallographic orientation for FIGS. 5(a), (b) and (c).

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Overview

The present invention reduces threading dislocation densities in a-GaN through the lateral overgrowth of a planar heteroepitaxial "seed" layer. Lateral overgrowth techniques require a processing step between two MOCVD growths, an initial heteroepitaxial growth and a regrowth that constitutes the lateral overgrowth. First, a thin patterned dielectric mask is applied to the seed layer. Upon regrowth, the GaN initially grows vertically through openings in the dielectric mask before laterally overgrowing the mask in directions perpendicular to the vertical growth direction. With the proper mask and regrowth conditions, dislocation densities are reduced in the laterally overgrown regions as compared to the regions that grow vertically through openings in the mask. Dislocations are reduced in the overgrown regions by (1) the mask blocking the propagation of dislocations vertically into the growing film and (2) the bending of dislocations through the transition from vertical to lateral growth.

Process Steps

Figure 1:
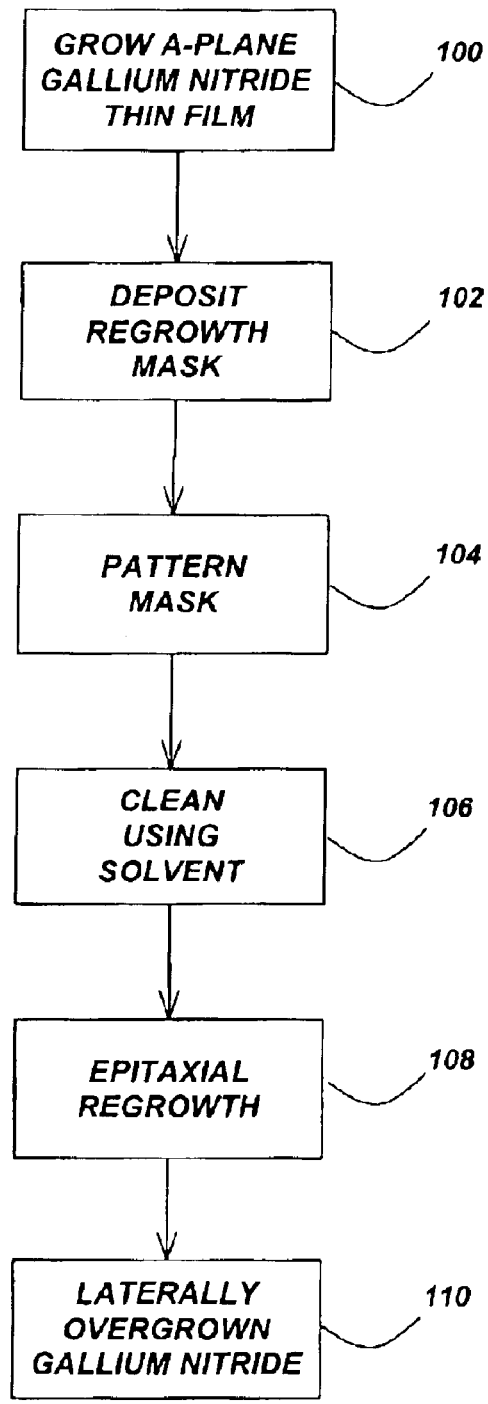
FIG. 1 is a flowchart that illustrates the steps for reducing threading dislocation densities in a-GaN through the lateral overgrowth of a planar heteroepitaxial "seed" layer, according to the preferred embodiment of the present invention.

FIG. 1 is a flowchart that illustrates the steps for reducing threading dislocation densities in a-GaN through the lateral overgrowth of a planar heteroepitaxial "seed" layer, according to the preferred embodiment of the present invention.

Block 100 represents growing non-polar (11$\bar{2}$0) a-plane GaN thin films on a (1$\bar{1}$02) r-plane sapphire substrate via MOCVD, as described in co-pending and commonly-assigned U.S. Provisional Patent Application Ser. No. 60/372,909, entitled "NON-POLAR GALLIUM NITRIDE BASED THIN FILMS AND HETEROSTRUCTURE MATERIALS," filed on Apr. 15, 2002, by Michael D. Craven, Stacia Keller, Steven P. DenBaars, Tal Margalith, James S. Speck, Shuji Nakamura, and Umesh K. Mishra, as well as co-pending and commonly-assigned U.S. Utility patent application Ser. No. 10/413,691, entitled "NON-POLAR A-PLANE GALLIUM NITRIDE THIN FILMS GROWN BY METALORGANIC CHEMICAL VAPOR DEPOSITION," filed on Apr. 15, 2003, by Michael D. Craven and James S. Speck, both of which applications are incorporated by reference herein. The heteroepitaxially-grown non-polar (11$\bar{2}$0) a-plane GaN thin film comprises a "seed layer" for the lateral overgrowth of the present invention.

Block 102 represents depositing a dielectric regrowth mask on the non-polar (11$\bar{2}$0) a-plane GaN film via plasma-enhanced chemical vapor deposition (PECVD). In the preferred embodiment, the mask is comprised of, but is not limited to, 200 nanometers (nm) of $SiO_2$.

Block 104 represents patterning the deposited mask, wherein the pattern is transferred to the SiO2 using conventional photolithographic techniques and wet etching with buffered hydrofluoric acid. Preferably, the deposited mask is patterned with long, narrow stripe openings oriented in a variety of crystallographic directions.

After patterning the mask, Block 106 represents cleaning the sample using solvents.

Block 108 represents performing a selective epitaxial regrowth to achieve the lateral overgrowth based on the patterned mask, wherein the gallium nitride initially grows vertically through openings in the mask before laterally overgrowing the mask in directions perpendicular to a vertical growth direction. Dislocation densities are reduced in the laterally overgrown regions as compared to regions that grow vertically through openings in the mask. Moreover, dislocations are reduced in the overgrown regions by the mask blocking propagation of dislocations vertically into the growing film and by bending of dislocations through a transition from vertical to lateral growth.

Preferably, Block 108 uses the same reactor conditions employed for the heteroepitaxial growth on the sapphire substrate, i.e., ~1100° C. growth temperature, ~1300 V/III ratio, and ~0.1 atmospheric (atm) growth pressure, although modified conditions could be used.

Block 110 represents the resulting lateral overgrowth, wherein the lateral overgrowth comprises laterally overgrown GaN formed stripes, as determined by the underlying mask pattern. The overgrown stripe morphology is dependent on the crystallographic orientation of the mask stripe. For example, stripes aligned to $[1\bar{1}00]_{GaN}$ have rectangular cross-sections and exhibit substantial dislocation reduction in the overgrown regions.

Potential devices that may be manufactured using this method include laser diodes (LDs), light emitting diodes (LEDs), resonant cavity LEDs (RC-LEDs), vertical cavity surface emitting lasers (VCSELs), high electron mobility transistors (HEMTs), heterojunction bipolar transistors (HBTs), heterojunction field effect transistors (HFETs), as well as UV and near-UV photodetectors.

Experimental Results

Experimental results found that lateral epitaxial overgrowth was successful in reducing the threading dislocation densities of non-polar (11$\bar{2}$0) a-plane GaN films. This section reports on the dependence of morphology and defect reduction on crystallographic stripe orientation.

Stripes aligned along [0001] and [$\bar{1}$100], the most favorable a-plane GaN LEO stripe orientations, possessed well-behaved, symmetric morphologies. Threading dislocation reduction via mask blocking was observed by transmission electron microscopy (TEM) for [$\bar{1}$100] stripes that had optimal rectangular cross-sections. Cathodoluminescence (CL) studies showed increased light emission for the overgrown regions in comparison to the window regions. The extent of lateral overgrowth of these stripes was asymmetric due to the opposing polarities of the vertical c-plane sidewalls. Conversely, threading dislocations propagated into the symmetric overgrown regions of [0001] stripes which possessed coexisting inclined and vertical {10$\bar{1}$0} facets.

The stripe morphology was observed using a JEOL 6300™ field emission scanning electron microscope (FE-SEM) operating at 5 kV. The microstructure of the lateral overgrowth was studied in cross-section using a JEOL 2000FX™ transmission electron microscope (TEM) operating at 200 kV. Cathodoluminescence (CL) images were obtained at room temperature using a Gatan MonoCL™ attached to the JEOL 6300™ FE-SEM and provided spatial maps of the luminescence from the laterally overgrown stripes.

As has been shown for laterally overgrown c-plane GaN, the crystallographic orientation of the mask stripe openings dictate the facets that form and, hence, the characteristics of the lateral overgrowth. See Reference 14. To investigate the orientation dependence of the laterally overgrown a-GaN, the SiO2 mask was patterned with an array of rectangular mask openings (windows) which formed a "wagon wheel" design. The windows that made up the wagon wheel pattern were 5 μm wide and oriented in 5° intervals so that a range of crystallographic mask orientations could be analyzed in a single MOCVD growth run. This experimental design is similar to that employed for the initial investigations of laterally overgrown c-plane GaN from linear mask openings. See References 14 and 15.

Figure 2:
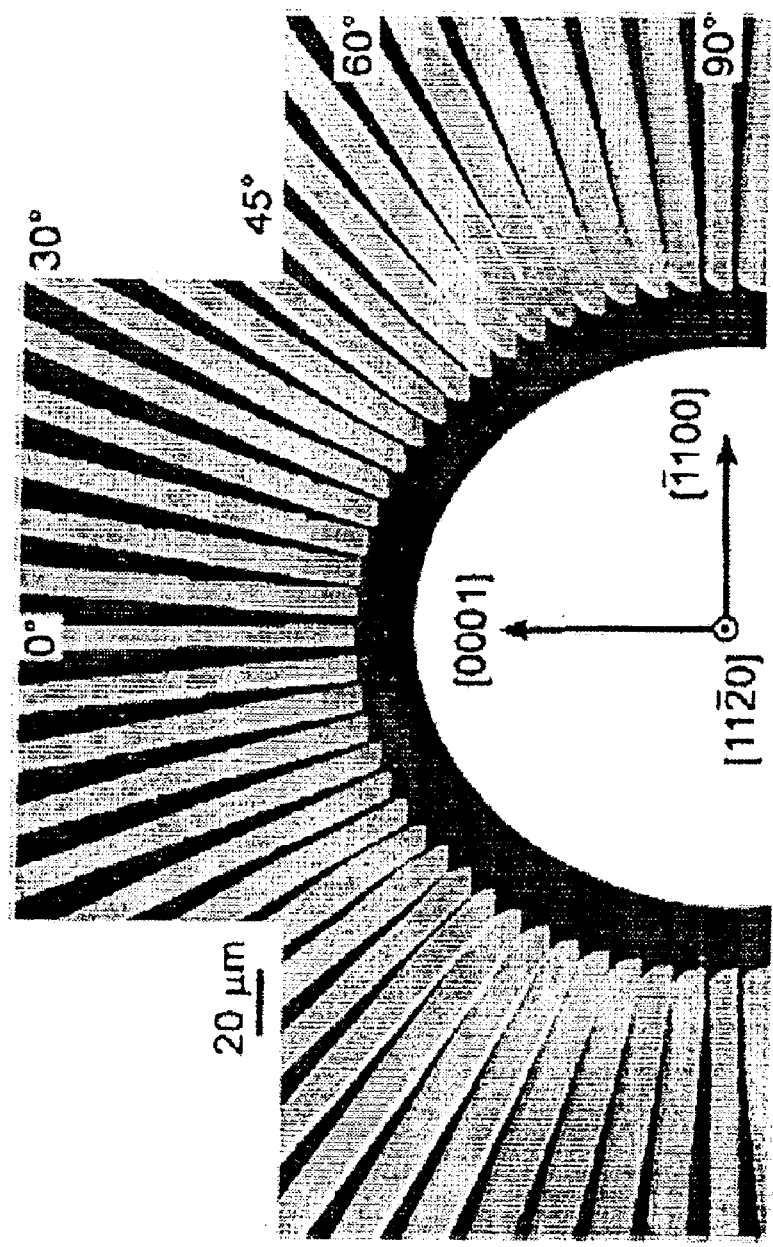
FIG. 2 is a plan-view scanning electron microscopy (SEM) image montage showing half of an a-GaN LEO wagon wheel pattern.

FIG. 2 is a plan-view scanning electron microscopy (SEM) image montage showing half of an a-GaN LEO wagon wheel pattern. The angles are included to facilitate reference to the wagon wheel pattern where 0° corresponds to the GaN c-axis [0001]. The reduced symmetry of the a-GaN surface (with respect to the c-GaN surface) is apparent in the stripe orientation dependence shown in FIG. 2, which is a 180° view of a single wagon wheel pattern. Primarily, this plan-view SEM image shows that lateral overgrowth occurred for all possible stripe orientations. Upon closer inspection, three stripe orientations had uniform morphologies without faceted sidewalls: parallel to [0001], 45° off, and perpendicular to the GaN c-axis (stripes parallel to the [$\bar{1}$100] direction). The stripes oriented 45° off the c-axis are indexed as [$\bar{1}$101] stripes since this crystallographic direction makes a 46.8° angle with the c-axis. FIG. 2 shows that as the stripe orientation changed from [0001] to [$\bar{1}$100], the stripe width increased until a maximum width was reached for stripes aligned 70° off the c-axis. After reaching this maximum, the stripe width decreased until it reached [$\bar{1}$100]. Note that specific crystallographic indexing is consistently used throughout this description due to the reduced symmetry of this film/substrate system in comparison to c-GaN.

Figure 3:
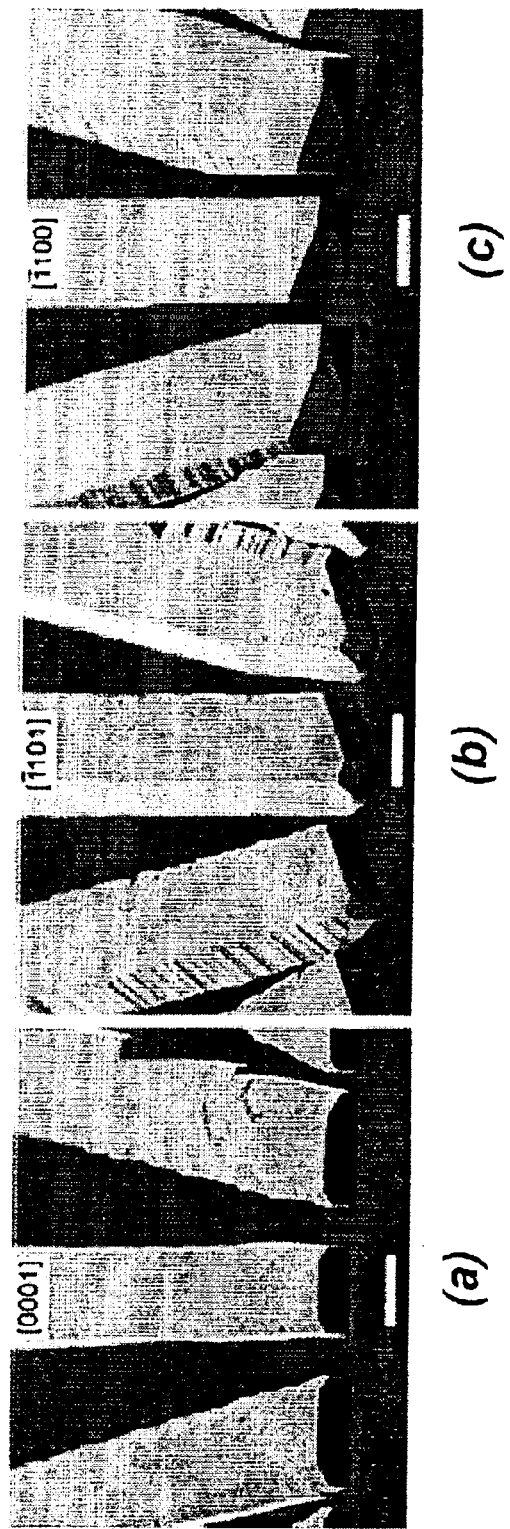
FIGS. 3(a), (b) and (c) are a series of SEM images with inclined views of the three stripes oriented parallel to [0001], [$\bar{1}$101], and [$\bar{1}$100], respectively.

An additional perspective is required to clearly observe the effects of stripe orientation on a-GaN LEO morphology. FIGS. 3(a), (b) and (c) are a series of SEM images with inclined views of the three stripes oriented parallel to [0001], [$\bar{1}$101], and [$\bar{1}$100], respectively, wherein the images correspond to the 0°, 45°, and 90° orientation labeling in FIG. 2 (and having a scale bar representing 55 μm).

For the growth conditions employed, [0001] and [$\bar{1}$101] stripes had various combinations of inclined and vertical sidewalls. Specifically, symmetric morphologies were observed for the [0001] stripes, while the [$\bar{1}$101] stripes had asymmetric morphologies with one microfaceted vertical (1$\bar{1}$02) sidewall and one inclined (1$\bar{1}$02) sidewall. The [0001] stripes had coexisting vertical and inclined facets from the same crystallographic family of {10$\bar{1}$0} planes. Conversely, [$\bar{1}$100] stripes had rectangular cross-sections with vertical (0001) basal plane sidewalls. Overall, [0001] and [$\bar{1}$100] stripe orientations yielded uniform, symmetric morphologies.

Figure 4:
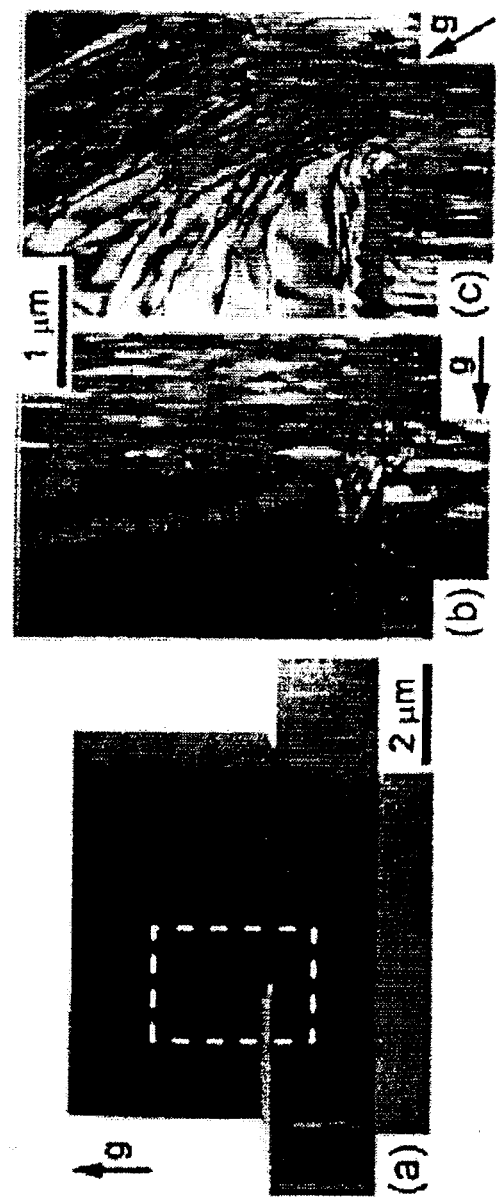
FIGS. 4(a), (b) and (c) are cross-sectional TEM images of a [$\bar{1}$100] stripe.

FIGS. 4(a), (b) and (c) are cross-sectional TEM images of a [$\bar{1}$100] stripe, wherein FIG. 4(a) shows threading dislocation reduction in the asymmetric overgrowth regions. Magnified views of the mask edge region defined by the dashed box in FIG. 4(a) are shown for FIG. 4(b) [$\bar{1}$100] and FIG. 4(c) [0001] stripes. The dislocation lines bend from the window region into the overgrowth region for stripes aligned along [0001], while no dislocation bending is observed for [$\bar{1}$100] stripes. FIGS. 4(a), (b) and (c) are bright-field images with various diffraction conditions: FIG. 4(a) g=11$\bar{2}$0, FIG. 4(b) g=0006, and FIG. 4(c) g=01$\bar{1}$0. Although the stripes imaged are from a parallel stripe pattern (and not a wagon wheel pattern), similar morphologies were observed regardless of the mask stripe pattern.

Threading dislocation (TD) reduction was observed for LEO stripes aligned along [$\bar{1}$100], as shown in the cross-section TEM image in FIG. 4(a). Mask blocking is the primary dislocation reduction mechanism since no dislocations were observed to bend in the direction of the lateral overgrowth, as shown in FIG. 4(b). Unlike [$\bar{1}$100] stripes, FIG. 4(c) shows that dislocations propagated into the overgrown regions of stripes aligned along [0001]. Although the precise origin of this dislocation bending is not yet known, the stability of inclined facets for the [0001] stripe orientation might play a key role.

In addition to TD reduction, FIG. 4(a) reveals an asymmetry in lateral overgrowth rates for [$\bar{1}$100] stripes. The existence of polar c-plane sidewalls explains this asymmetry. With the polar axis perpendicular to the stripe direction, one sidewall is the +c plane or Ga-face while the opposing sidewall is the –c plane or N-face. As expected, the Ga-face sidewall grew faster than the N-face sidewall by a factor of ~10 depending on the growth conditions. Note that the polarity of a-GaN on r-sapphire was previously determined using convergent beam electron diffraction measurements. See Reference 13. Since polarity had such a significant effect on the lateral overgrowth of the [$\bar{1}$100] stripes, the asymmetric morphologies observed in FIGS. 2 and 3 may be related to the low symmetry of the structure.

Figure 5:
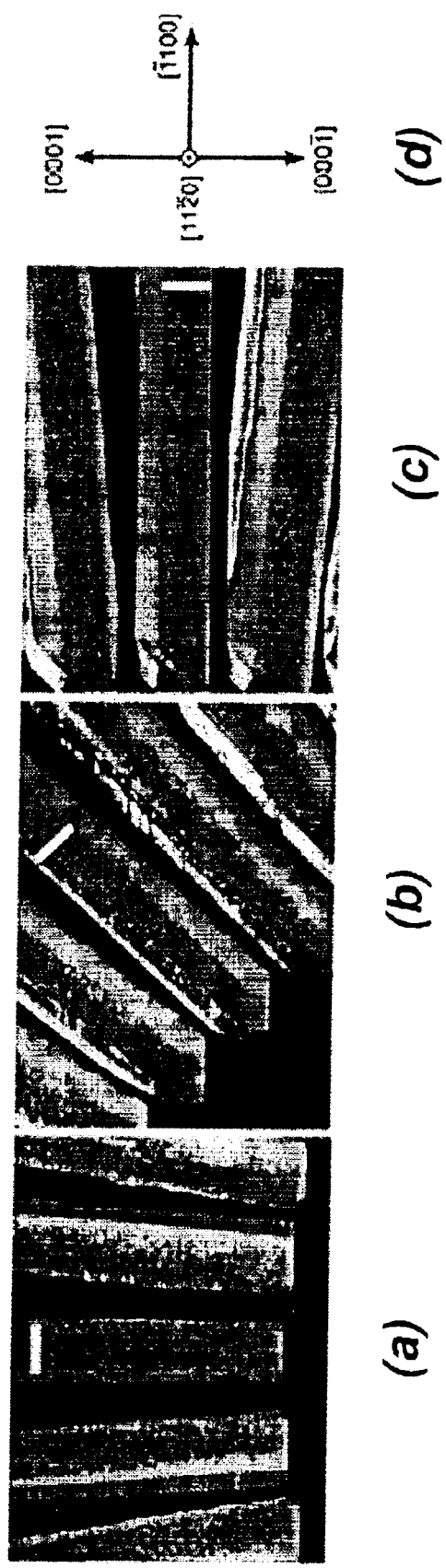

Additional evidence of the lateral overgrowth asymmetry for polar GaN was supplied by plan-view panchromatic CL images of [0001], [$\bar{1}$101], and [$\bar{1}$100] LEO stripes. FIGS. 5(a), (b) and (c) are plan-view panchromatic CL images of stripes oriented parallel to [0001], [$\bar{1}$101], and [$\bar{1}$100], while FIG. 5(d) illustrates the crystallographic orientation for FIGS. 5(a), (b) and (c). The CL images shown in FIGS. 5(a)–(c) directly correspond to the stripes imaged by SEM in FIGS. 3(a), (b) and (c) (and having a scale bar representing 55 μm). The mottled regions within each stripe orientation define the windows in the SiO$_2$ mask where TDs have extended unimpeded to the top surface of the LEO stripe. This CL characteristic has been observed in polar GaN LEO stripes. See References 16–18. The mottled area extends across the entire width of the [0001] stripe, which corresponds to the TEM observation of dislocation bending into the laterally overgrown regions for this stripe orientation. Even though the [0001] stripe shown in FIGS. 5(a)–(c) had little lateral overgrowth, CL measurements of wider stripes grown under similar conditions confirmed the dislocation bending observed in FIG. 4(c). The uniform luminescence from the overgrown regions of [1̄100] stripes confirms that those areas are relatively free of TDs. The effects of polarity on the lateral overgrowth rates of [1̄100] stripes are also clearly observed.

In summary, LEO of non-polar (112̄0) a-plane GaN films was demonstrated and TD density reduction was achieved. The low symmetry a-GaN surface exhibited LEO stripe morphologies that were dependent on crystallographic stripe alignment. Two primary orientations, [0001] and [1̄100], were observed to possess uniform, symmetric stripe morphologies; [1̄100] stripes had vertical sidewalls while [0001] stripes had coexisting vertical and inclined sidewalls. Dislocation reduction was achieved in [1̄100] stripes while dislocations propagated into the laterally overgrown regions of [0001] stripes. Between the [0001] and [1̄100] orientations, asymmetric stripe morphologies were observed. Except for [0001] stripes, which had a non-polar lateral growth direction, all stripes exhibited asymmetric lateral growth rates. Ongoing investigations continue to explore the unique structural features of non-polar GaN LEO.

REFERENCES

The following references are incorporated by reference herein:

1. I. P. Smorchkova, C. R. Elsass, J. P. Ibbetson, R. Vetury, B. Heying, P. Fini, E. Haus, S. P. DenBaars, J. S. Speck, and U. K. Mishra, J. Appl. Phys. 86, 4520 (1999).
2. O. Ambacher, J. Smart, J. R. Shealy, N. G. Weimann, K. Chu, M. Murphy, W. J. Schaff, L. F. Eastman, R. Dimitrov, L. Wittmer, M. Stutzmann, W. Rieger, and J. Hilsenbeck, J. Appl. Phys. 85, 3222 (1999).
3. I. J. Seo, H. Kollmer, J. Off, A. Sohmer, F. Scholz, and A. Hangleiter, Phys. Rev. B 57, R9435 (1998).
4. R. Langer, J. Simon, V. Ortiz, N. T. Pelekanos, A. Barski, R. Andre, and M. Godlewski, Appl. Phys. Lett. 74, 3827 (1999).
5. P. Lefebvre, J. Allegre, B. Gil, H. Mathieu, N. Grandjean, M. Leroux, J. Massies, and P. Bigenwald, Phys. Rev. B 59, 15363 (1999).
6. P. Lefebvre, A. Morel, M. Gallart, T. Taliercio, J. Allegre, B. Gil, H. Mathieu, B. Damilano, N. Grandjean, and J. Massies, Appl. Phys. Lett. 78, 1252 (2001).
7. T. Takeuchi, C. Wetzel, S. Yamaguchi, H. Sakai, H. Amano, I. Akasaki, Y. Kaneko, S. Nakagawa, Y. Yamaoka, and N. Yamada, Appl. Phys. Lett. 73, 1691 (1998).
8. T. S. Zheleva, N. Ok-Hyun, M. D. Bremser, and R. F. Davis, Appl. Phys. Lett. 71, 2472 (1997).
9. N. Ok-Hyun, M. D. Bremser, T. S. Zheleva, and R. F. Davis, Appl. Phys. Lett. 71, 2638 (1997).
10. H. Marchand, J. P. Ibbetson, P. T. Fini, P. Kozodoy, S. Keller, S. DenBaars, J. S. Speck, and U. K. Mishra, MRS Internet J. Nitride Semicond. Res. 3, 3 (1998).
11. H. Marchand, X. H. Wu, J. P. Ibbetson, P. T. Fini, P. Kozodoy, S. Keller, J. S. Speck, S. P. DenBaars, and U. K. Mishra, Appl. Phys. Lett. 73, 747 (1998).
12. S. Nakamura, M. Senoh, S. I. Nagahama, T. Matsushita, K. Kiyoku, Y. Sugimoto, T. Kozaki, H. Umemoto, M. Sano, and T. Mukai, Jpn. J. Appl. Phys., Part 2 38, L226 (1999).
13. M. D. Craven, S. H. Lim, F. Wu, J. S. Speck, and S. P. DenBaars, Appl. Phys. Lett. 81, 469 (2002).
14. D. Kapolnek, S. Keller, R. Vetury, R. D. Underwood, P. Kozodoy, S. P. DenBaars, and U. K. Mishra, Appl. Phys. Lett. 71, 1204 (1997).
15. J. Park, P. A. Grudowski, C. J. Eiting, and R. D. Dupuis, Appl. Phys. Lett. 73, 333 (1998).
16. S. J. Rosner, G. Girolami, H. Marchand, P. T. Fini, J. P. Ibbetson, L. Zhao, S. Keller, U. K. Mishra, S. P. DenBaars, and J. S. Speck, Appl. Phys. Lett. 74, 2035 (1999).
17. J. A. Freitas, Jr., N. Ok-Hyun, R. F. Davis, G. V. Saparin, and S. K. Obyden, Appl. Phys. Lett. 72, 2990 (1998).
18. Z. Yu, M. A. L. Johnson, J. D. Brown, N. A. El-Masry, J. F. Muth, J. W. Cook, Jr., J. F. Schetzina, K. W. Haberern, H. S. Kong, and J. A. Edmond, MRS Internet J. Nitride Semicond. Res. 4S1, G4.3 (1999).
19. T. S. Zheleva, S. A. Smith, D. B. Thomson, T. Gehrke, K. J. Linthicum, P. Rajagopal, E. Carlson, W. M. Ashmawi, and R. F. Davis, MRS Internet Journal of Nitride Semiconductor Research 4S1 (1999).

CONCLUSION

This concludes the description of the preferred embodiment of the present invention. The following describes some alternative embodiments for accomplishing the present invention.

The crucial aspects of lateral overgrowth techniques are the dielectric mask specifications and the MOCVD regrowth conditions. A variety of dielectric materials, deposition techniques, and patterning methods can be employed to fabricate effective masks for lateral overgrowth. In addition, modifying the orientation, design, and dimensions of the mask pattern will ultimately determine the characteristics of the subsequent lateral overgrowth. Sufficient control of the lateral overgrowth is required in order to achieve dislocation reduction and to completely overgrow the mask such that a planar film is reformed. The specific details of the lateral overgrowth, including lateral-to-vertical growth rate ratio and sidewall facet stability, are controlled via the MOCVD regrowth conditions. MOCVD growth conditions are reactor dependent and may vary between specific reactor designs. Fundamental variations in conditions such as growth temperature, growth pressure, V/III ratio, precursor flows, and source materials are potential modifications of this invention.

In addition, the dislocation reduction can also be achieved using alternative overgrowth methods. For example, cantilever epitaxy, double lateral epitaxial overgrowth (double LEO), and SiN nanomasking techniques could be used as alternatives to lateral epitaxial overgrowth.

Further, although non-polar a-plan GaN thin films are described herein, the same techniques are applicable to non-polar m-plane GaN thin films. Moreover, non-polar InN, AlN, and AlInGaN thin films could be used instead of GaN thin films.

Finally, substrates other than sapphire substrate could be employed for non-polar GaN growth. These substrates include silicon carbide, gallium nitride, silicon, zinc oxide, boron nitride, lithium aluminate, lithium niobate, germanium, aluminum nitride, and lithium gallate.

In summary, the present invention describes lateral epitaxial overgrowth of non-polar (112̄0) a-plane GaN seed layers which results in threading dislocation reduction. First, a thin patterned dielectric mask is applied to the seed layer. Second, a selective epitaxial regrowth is performed to achieve lateral overgrowth of the patterned mask. Upon regrowth, the GaN films initially grow vertically through openings in the dielectric mask before laterally overgrowing the mask in directions perpendicular to the vertical growth direction. Threading dislocations are reduced in the overgrown regions by (1) the mask blocking the propagation of dislocations vertically into the growing film and (2) the bending of dislocations through the transition from vertical to lateral growth.

The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A method of reducing threading dislocation densities in a non-polar a-plane gallium nitride thin film, comprising:
   (a) depositing a dielectric regrowth mask on the non-polar a-plane gallium nitride thin film;
   (b) patterning the deposited mask; and
   (c) performing a selective regrowth to achieve an overgrowth based on the patterned mask.

2. The method of claim 1, wherein the non-polar a-plane gallium nitride thin film comprises a seed layer.

3. The method of claim 1, wherein the depositing step comprises depositing the dielectric regrowth mask on the non-polar a-plane gallium nitride thin film via plasma-enhanced chemical vapor deposition (PECVD).

4. The method of claim 1, wherein the deposited mask is patterned with long, narrow stripe openings oriented in a variety of crystallographic directions.

5. The method of claim 1, wherein the overgrowth comprises laterally overgrown gallium nitride formed stripes.

6. The method of claim 1, wherein the performing step comprises performing a selective regrowth of the gallium nitride to achieve the overgrowth based on the patterned mask, and the gallium nitride initially grows vertically through openings in the mask before laterally overgrowing the mask in directions perpendicular to a vertical growth direction.

7. The method of claim 6, wherein laterally overgrown regions contain reduced dislocation densities, as compared to regions that grow vertically through openings in the mask.

8. The method of claim 7, wherein dislocations are reduced in the overgrown regions by the mask blocking propagation of dislocations vertically into the growing film.

9. The method of claim 7, wherein dislocations are reduced in the overgrown regions by bending of dislocations through a transition from vertical to lateral growth.

10. The method of claim 1, wherein the overgrowth is performed using a lateral epitaxial overgrowth.

11. The method of claim 1, wherein the overgrowth is performed using a method selected from a group comprising cantilever epitaxy, double lateral epitaxial overgrowth (double LEO), and SiN nanomasking.

12. A non-polar a-plane gallium nitride thin film with reduced threading dislocation densities, wherein the thin film is created using a process comprising:
    (a) depositing a dielectric regrowth mask on the non-polar a-plane gallium nitride thin film;
    (b) patterning the deposited mask; and
    (c) performing a selective regrowth to achieve an overgrowth based on the patterned mask.

13. The thin film of claim 12, wherein the non-polar a-plane gallium nitride thin film comprises a seed layer.

14. The thin film of claim 12, wherein the depositing step comprises depositing the dielectric regrowth mask on the non-polar a-plane gallium nitride thin film via plasma-enhanced chemical vapor deposition (PECVD).

15. The thin film of claim 12, wherein the deposited mask is patterned with long, narrow stripe openings oriented in a variety of crystallographic directions.

16. The thin film of claim 12, wherein the overgrowth comprises laterally overgrown gallium nitride formed stripes.

17. The thin film of claim 12, wherein the performing step comprises performing a selective regrowth of the gallium nitride to achieve the overgrowth based on the patterned mask, and the gallium nitride initially grows vertically through openings in the mask before laterally overgrowing the mask in directions perpendicular to a vertical growth direction.

18. The thin film of claim 17, wherein laterally overgrown regions contain reduced dislocation densities, as compared to regions that grow vertically through openings in the mask.

19. The thin film of claim 18, wherein dislocations are reduced in the overgrown regions by the mask blocking propagation of dislocations vertically into the growing film.

20. The thin film of claim 18, wherein dislocations are reduced in the overgrown regions by bending of dislocations through a transition from vertical to lateral growth.

21. The thin film of claim 12, wherein the overgrowth is performed using a lateral epitaxial overgrowth.

22. The thin film of claim 12, wherein the overgrowth is performed using a method selected from a group comprising cantilever epitaxy, double lateral epitaxial overgrowth (double LEO), and SiN nanomasking.

* * * * *

UNITED STATES PATENT AND TRADEMARK OFFICE
CERTIFICATE OF CORRECTION

PATENT NO. : 6,900,070 B2  
APPLICATION NO. : 10/413913  
DATED : May 31, 2005  
INVENTOR(S) : Michael D. Craven et al.

Page 1 of 1

It is certified that error appears in the above-identified patent and that said Letters Patent is hereby corrected as shown below:

Title Page # 56
Other Publications, delete "U.S. Appln. No. 60/372,909, filed Apr. 15, 2002.*"

Page 3
Other Publications, delete the following duplicate references:
"Amano, H. et al...pp 353-355"
"Ambacher, O et al....p3222-3233"
"Bottcher T., et al. pp. 1976-1978,"
"Brandt, O., et al.....pp. 577-585"
"Craven, M.D., et al "Characterization of a-Plane ...Deposition"...pp. L235-L238"
"Craven., M.D., et al. "Threading dislocation reduction..a-plane GaN"...pp. 1201-1203."
"Dovidenko, K., et al....pp 4296-4299"
"Eastman, L.F....p. 28-31"
"Eddy, C.R., Jr., ..pp. 448-455"
"Etzkom E.V., et al....pp.1025-1034"
"Freitas, J.A., et al....pp. 2990-2992"
"Grandjean, N., et al., pp.3714-3720"
"Heying, B., et al." pp. 643-445"

Signed and Sealed this

Twentieth Day of March, 2007

JON W. DUDAS
*Director of the United States Patent and Trademark Office*